(12) United States Patent
Hsieh et al.

(10) Patent No.: US 11,664,791 B2
(45) Date of Patent: May 30, 2023

(54) AC COUPLED DUTY-CYCLE CORRECTION

(71) Applicant: Micron Technology, Inc., Boise, ID (US)

(72) Inventors: Ming-ta Hsieh, Woodbury, MN (US); Taylor Loftsgaarden, Eden Prairie, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/463,981

(22) Filed: Sep. 1, 2021

(65) Prior Publication Data

US 2023/0064239 A1    Mar. 2, 2023

(51) Int. Cl.
  *H03K 5/00*     (2006.01)
  *H03K 5/156*    (2006.01)
  *H03K 5/131*    (2014.01)

(52) U.S. Cl.
  CPC ......... *H03K 5/00006* (2013.01); *H03K 5/131* (2013.01); *H03K 5/1565* (2013.01)

(58) Field of Classification Search
  CPC ... H03K 5/00006; H03K 5/131; H03K 5/1565
  See application file for complete search history.

(56) References Cited

U.S. PATENT DOCUMENTS

| 6,285,226 | B1   | 9/2001  | Nguyen   |            |
|-----------|------|---------|----------|------------|
| 6,643,790 | B1   | 11/2003 | Yu       |            |
| 6,690,218 | B2   | 2/2004  | Goldblatt|            |
| 7,005,904 | B2   | 2/2006  | Minzoni  |            |
| 8,248,130 | B2   | 8/2012  | Jain     |            |
| 11,165,431| B1 * | 11/2021 | Kenney   | H03L 7/0818|
| 11,206,014| B1 * | 12/2021 | Ng       | H03K 5/00006|

* cited by examiner

*Primary Examiner* — Cassandra F Cox
(74) *Attorney, Agent, or Firm* — Brooks, Cameron & Huebsch, PLLC

(57) ABSTRACT

A method includes performing a duty-cycle correction. The method can include inputting a signal to a duty-cycle correction circuit. The method can further include transferring the signal through an alternating current-coupling (AC-coupling) component of the duty-cycle correction circuit. The method can further include transferring the signal through a feedback circuit, wherein the feedback circuit comprises a plurality of resistors. The method can further include outputting a signal that includes a corrected duty-cycle with a particular amount of duty-cycle distortion.

23 Claims, 6 Drawing Sheets

AC COUPLED DUTY-CYCLE CORRECTION

TECHNICAL FIELD

Embodiments of the disclosure relate generally to electronic systems, and more specifically, relate to AC coupled duty-cycle correction.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices. The memory sub-system can use a duty-cycle to operate a memory device.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
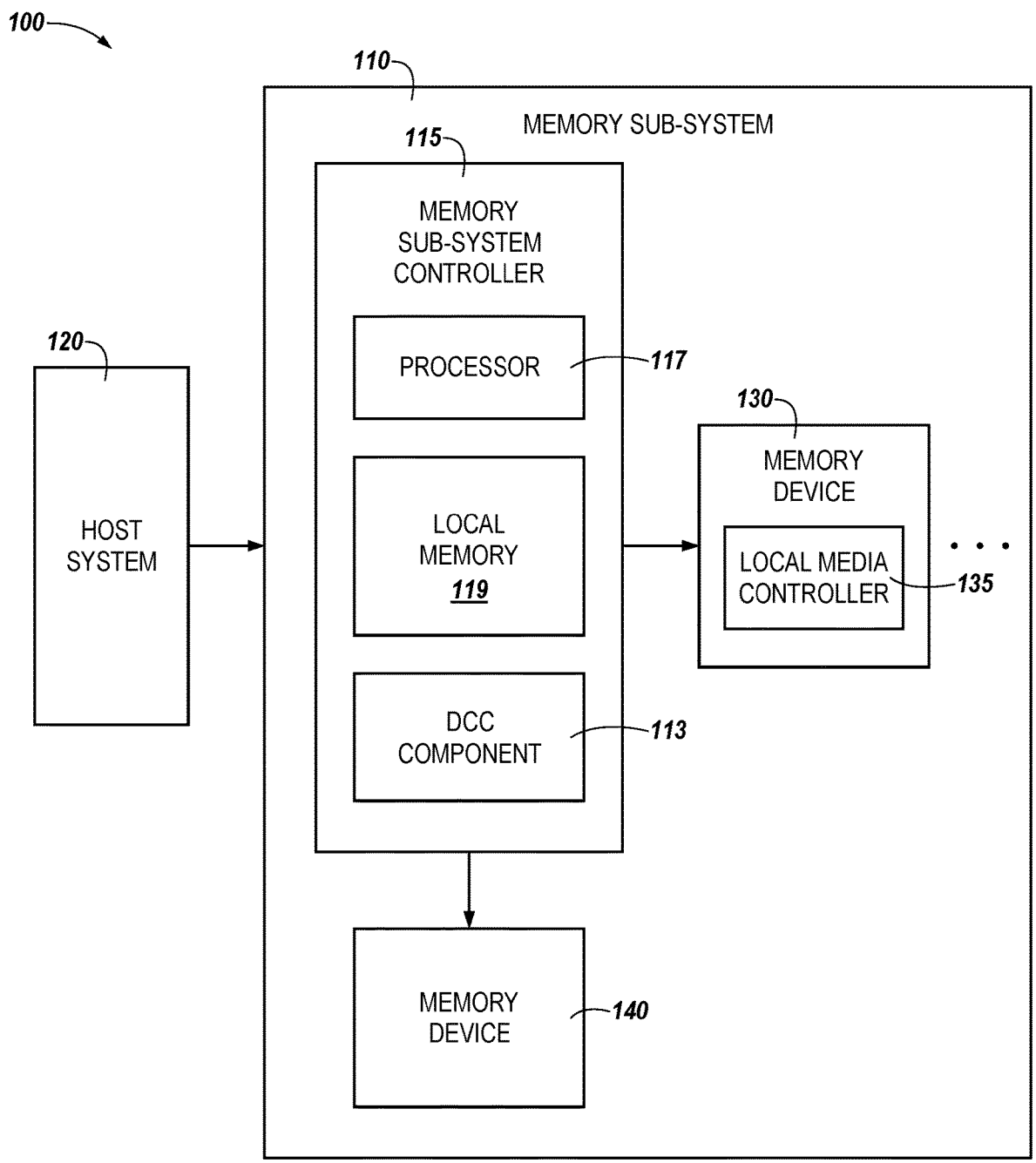
FIG. 1 illustrates an example computing system that includes an AC coupled duty-cycle correction component in accordance with some embodiments of the present disclosure.

Aspects of the present disclosure are directed to an alternating current-coupled (AC-coupled) duty-cycle correction, in particular to memory sub-systems that include a memory sub-system AC-coupled duty-cycle correction component used to correct distortion of a duty-cycle of a memory sub-system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

During operation of a memory sub-system, digital circuits of the memory sub-system can use a clock signal to operate. One type of circuit that requires a clock signal to operate is memory, such as a dynamic random access memory (DRAM), synchronous dynamic random access memory (SDRAM), and double data rate synchronous dynamic random access memory (DDR-SDRAM). For memory circuits operating at high frequencies, a clock signal having a duty-cycle as close to 50% as possible may be desired so that the memory has approximately an equal amount of time on both the logic high and the logic low portions of the clock signal for transferring data. A duty-cycle of 50% can allow a maximum amount of time for latching both rising edge data and falling edge data in a memory circuit.

A duty-cycle can have duty-cycle distortion, which is a measure of the time separation between the rising edge and falling edge at the 50% level of a middle threshold of the duty-cycle. Duty-cycle distortion can be caused by "1"s having a different duration than "0" s. Further, duty-cycle distortion can be a type of deterministic jitter in which the clock cycle generates positive pulses that are not equal to negative pulses. These duty-cycle distortions can have an affect on the memory operations and also the accuracy of the data. Specifically, high-speed signal performance can be sensitive to the signal duty-cycle distortion.

Some previous approaches have attempted to directly change a clock buffer's pull-up or pull-down using a direct current (DC) based design. Such a design may not reduce the input to the DCD component. Further, a step size associated with the duty-cycle distortion correction may not be linear and the duty-cycle distortion correction may have scaled with the pull-up/pull-down driving strength adjustment. This prior approach may also be more sensitive to supply and/or temperature variations. For example, this can be due to an instability in the pull-up/pull-down driving strength as a function of supply and/or temperature.

In various embodiments described herein, an alternating current (AC)-coupled duty-cycle correction can reduce an input to the DCD component, which reduced the required effort to correct the combined inputs and down-stream DCD components. Further, aspects of the present disclosure address the above and other deficiencies in the following ways. As an example, a DC bias adjustment at an AC-coupled output can allow more linear and finer step size correction. Also, a tunable driving strength at the AC-coupled input can allow for adjustment of the duty-cycle correction range for different data rates. Furthermore, the DC-coupled switch, as described below, at initiation of the duty-cycle correction, can provide for a shortened settling time and minimize the initial voltage overshoot or undershoot during startup of the circuit described herein. As an example, since the closed position of the switch forces the voltage across the capacitor to be a voltage of zero in the initial condition before the open position of the switch, the input voltage at the inverter only has the DC bias voltage error due to the needed right level for correcting DCD output. This can reduce the time that is needed to settle the circuit.

FIG. 1 illustrates an example computing system 100 that includes a duty-cycle correction component 113 in accordance with some embodiments of the present disclosure. The computing system 100 includes a memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD).

Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a duty-cycle correction ("DCC") component 113. Although not shown in FIG. 1 so as to not obfuscate the drawings, the DCC component 113 can include various circuitry, such as a duty-cycle correction circuit, to facilitate inputting a signal to a duty-cycle correction component, transferring the signal through an AC-coupling component of the duty-cycle correction component, transferring the signal through a feedback circuit, and outputting a signal that includes a corrected duty-cycle with a particular amount of duty-cycle distortion.

Figure 2:
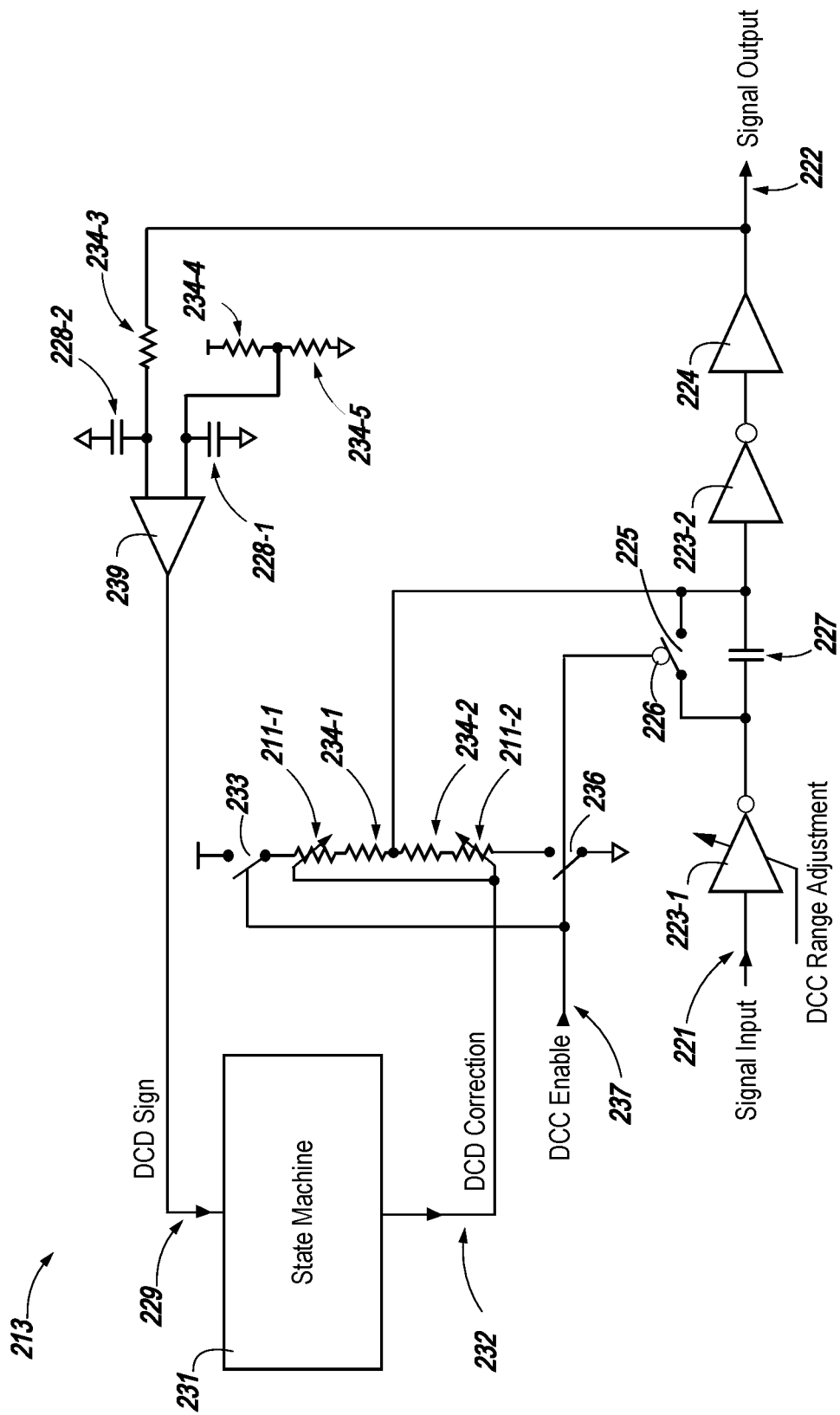
FIG. 2 illustrates an example AC coupled duty-cycle correction circuit and additional circuitry in accordance with some embodiments of the present disclosure.
Figure 3:
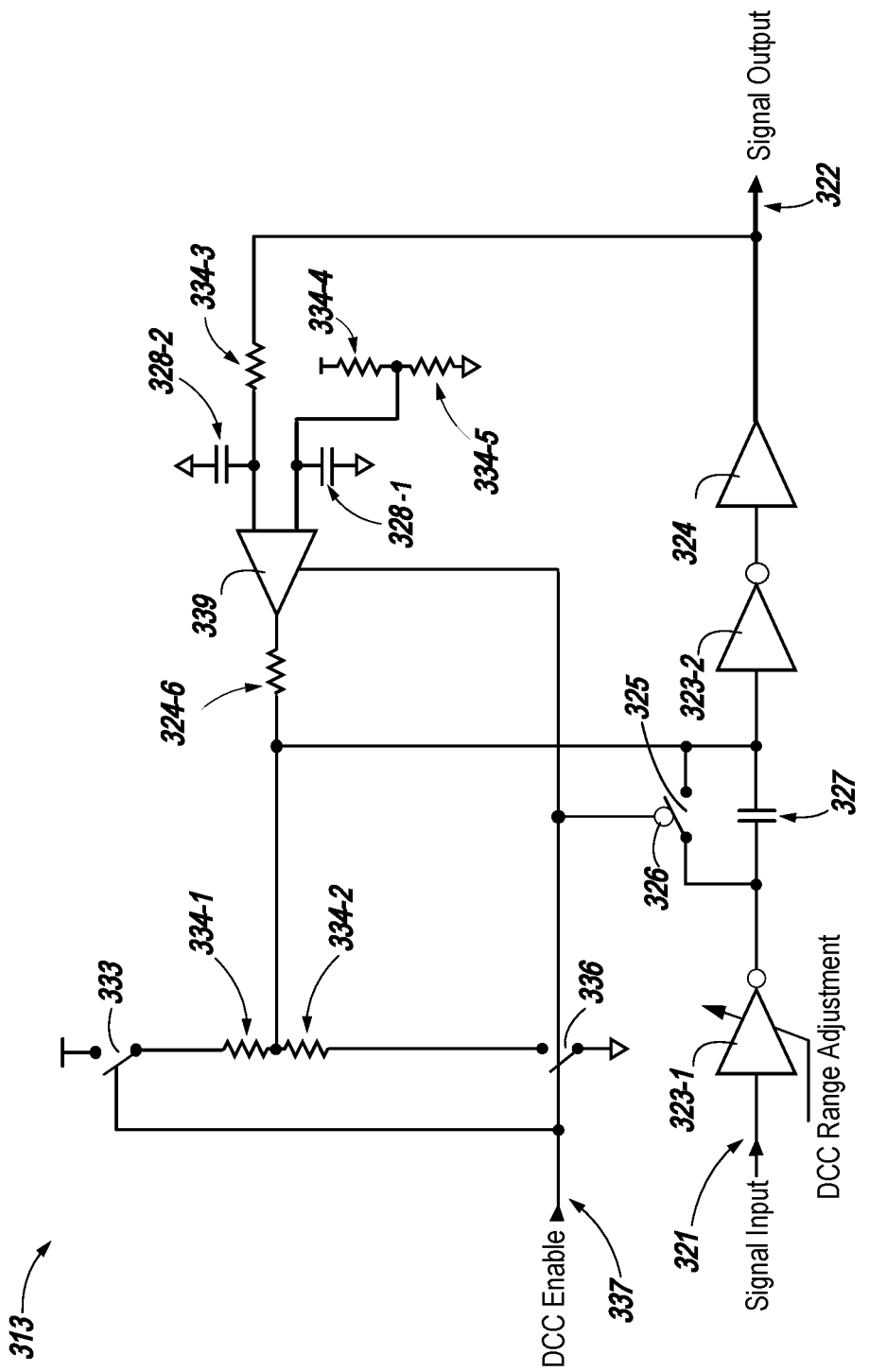
FIG. 3 illustrates an example AC coupled duty-cycle correction circuit and additional circuitry in accordance with some embodiments of the present disclosure.

In some embodiments, and as illustrated in FIGS. 2-3, this AC-coupling component can be a capacitor. In some embodiments, the DCC component 113 can include a special purpose circuitry in the form of an ASIC, FPGA, state machine, and/or other logic circuitry that can allow the DCC component 113 to orchestrate and/or perform operations to selectively perform correction of a duty-cycle for the memory device 130 and/or the memory device 140.

In some embodiments, the memory sub-system controller 115 includes at least a portion of the DCC component 113. For example, the memory sub-system controller 115 can include a processor 117 (processing device) configured to execute instructions stored in local memory 119 for performing the operations described herein. In some embodiments, the DCC component 113 is part of the host system 110, an application, or an operating system.

In a non-limiting example, an apparatus (e.g., the computing system 100) can include a memory sub-system DCC component 113. The memory sub-system DCC component 113 can be resident on the memory sub-system 110. As used herein, the term "resident on" refers to something that is physically located on a particular component. For example, the memory sub-system DCC component 113 being "resident on" the memory sub-system 110 refers to a condition in which the hardware circuitry that includes the memory sub-system DCC component 113 is physically located on the memory sub-system 110. The term "resident on" may be used interchangeably with other terms such as "deployed on" or "located on," herein.

The memory sub-system DCC component 113 can be configured to receive a signal from a host and/or other device external to the memory sub-system 110. The signal can be transferred through a DCC component (such as DCC component 225 in FIGS. 2 and 325 in FIG. 3) in response to the DCC component being in a closed position. The signal can be transferred through a circuit to bypass the DCC component in response to the DCC component being in an open position. In some examples, the DCC component can be a switch capable of altering a pathway of the signal once it is received. In response to the DCC component being in the open position, the signal can be transferred through the AC-coupling component (such as AC-coupling component 227 in FIGS. 2 and 327 in FIG. 3). In some examples, in response to the switch being in an open position, a duty-cycle signal includes an initial amount of distortion. In response to the switch being in a closed position, the duty-cycle signal includes a second amount of distortion. In some examples, the first amount is less than the second amount. The AC-coupling component, in some examples, can be a capacitor.

In another non-limiting example, a system (e.g., the computing system 100) can include a memory sub-system 110 including memory components arranged to form a stackable cross-gridded array of memory cells. A processing device (e.g., the processor 117 and/or the local media controller 135) can be coupled to the memory components and can perform operations including correcting the duty-cycle distortion using the AC-coupling component. For example, the processing device can be configured to perform operations including performing a number of cycle operations in order to correct the duty-cycle distortions.

FIG. 2 illustrates an example duty-cycle correction circuit 213 and additional circuitry in accordance with some embodiments of the present disclosure. While illustrated as including all of the elements of FIG. 2, the examples of the duty-cycle correction circuit 213 are not so limited. For example, any portion of the elements of FIG. 2 capable of performing the operations for duty-cycle correction described below can be referred to as the duty-cycle correction circuit 213. Further, while an example of a memory sub-system is provided herein, examples of the duty-cycle correction component can be used within systems more broadly than this context. In the illustrated example of FIG. 2, the duty-cycle correction component 213 comprises a number of inverters (e.g., inverting buffers) 223-1, 223-2 (hereinafter referred to collectively as number of inverters 223), a buffer (e.g., a non-inverting buffer) 224, and a voltage comparator 239, a number of resistors 234-1, 234-2, 234-3, 234-4, 234-5 (hereinafter referred to collectively as number of resistors 234), and a number of variable resistors 211-1 and 211-2 (hereinafter referred to collectively as number of variable resistors 211). The number of inverters 223 can be a number of NOT logic gates. A voltage comparator 239 can be a high-gain electronic voltage amplifier with a differential input and, usually, a single-ended output, as is illustrated in FIG. 2. In this configuration, the non-inverting buffer 224 can represent a signal path and its output (node 222) can be the signal point expected to have the signal duty-cycle as close to 50% as possible.

An input signal 221 can be input to the duty-cycle correction circuit 213 and can pass through a first inverter 223-1. In one example, the first inverter 223-1 can be an inverter. The first inverter 223-1 can be used to adjust a range of the duty-cycle correction (indicated by the illustrated arrow through inverter 223-1). As an example, changing an output rate of the inverter can allow changes to the DCD correction step for a given DC bias voltage step. In another example, increasing a slew rate into the capacitor 227 can make the signal take longer to get from the DC bias point set by resistors 211 and 234 to the threshold of inverter 223-2. This longer transition time corresponds to an increase in the range of duty-cycle correction that can be applied by a given resistor ladder (i.e., the duty-cycle correction (in units of time) is offset/slow, the programmable slew rate can decrease slew, increasing the resolution and correction range). The signal that is transferred through the first inverter 223-1 can be received at an alternating current-coupling ("AC-coupling") component 227. In response to a switch 225 being in a closed (or ON) position, the signal can bypass the AC-coupling component 227 and provide a zero voltage initial conditional across the AC-coupling component 227. In response to the switch 225 being in an open (or OFF) position, the signal can be directed through the AC-coupling component 227. When DCC is enabled, the resistor ladder (components 211 and 234) can pull the input to 223-2 to the mid-rail, for signals that do not contain high frequency content, this can result in an undesirable crowbar condition. The functionality to bypass the AC-coupling component 227 is desirable for modes in which lower frequency signals, which may not require duty-cycle correction, may be passed. This low frequency bypass mode can allow the AC-coupling component 227 and the resistors 211 and 234 to be optimized for high-speed signal correction.

As an example, a high-speed signal can refer to a speed greater than a giga-bit per second (Gbps) operation speed unless a large capacitance value used in the AC-coupled output or a large resistance used in the bias adjust AC-coupled output node DC bias voltage. This can be due to an RC constant discharging the signal at the AC-coupled output node. A large resistance (R) or a large capacitance (C) can use a greater design layout area. As an example, a large capacitance consumes more power. For example, a 10,000 Ohm resistor and a 100 femto-farad (if) capacitor can have an RC time constant of 1 ns=R×C. In this example, a 1 giga-hertz (GHz) clock can have a 1 nanosecond clock period.

A DCC enable signal 237 can be used to enable correction of the duty-cycle distortion. As an example, the DCC enable signal 237 can enable an opening of switch 233 and an opening of the switch 225 to disable the DC coupling of the duty-cycle correction circuit 213. The signal on an opposite side of the AC-coupling component 227 than the input signal 221 can be input to a second inverter 223-2. The output of the second inverter 223-2 can be input to a buffer 224. The signal output from the buffer 224 corresponds to the output signal 222 of the duty-cycle correction circuit 213. When the DCC enable signal is not activated, the switch 225 of the DC coupling can be closed and the resistors 234-1 and 234-2 can be opened, thereby disabling the duty-cycle correction of the output signal 222. The transition from a close (or "ON") to an open (or "OFF") position of the switch 225 provides a zero voltage initial condition across the AC-coupling component 227 which minimizes overshooting or undershooting of an initial voltage condition and can provide a fast voltage setting time seen at the input of inverter 223-2.

A distortion of a duty-cycle associated with the input signal 221 can be reduced (e.g., minimized) by using the AC-coupling component 227, the DC component node 226, the number of resistors 234, the number of inverters 223, the number of buffers 224, and a state machine 231, resulting in the signal output 222 with the reduced distortion of the duty-cycle. The distortion of the duty-cycle can be achieved with the number of resistors 234 and the state machine 231. The state machine 231 can be a digital duty correction distortion calibration state machine. As an example, the state machine 231 can be used to digitally correct a distortion of the duty-cycle. The duty-cycle distortion correction output 232 (e.g., the "DCD Correction") of the state machine 231 can be input through the resistors 234-1, 234-2 and the variable resistors 211-1, 211-2 and be an input signal to the first inverter 223-2 which provides an adjustment of a DC voltage level at the input of the second inverter 223-2 as a mechanism to correct duty-cycle distortion seen at the output signal of the buffer 224. The digital calibration of the state machine 231 can refer to an adjustment of the variable resistors 211 by the output 232 to achieve the correct duty-cycle distortion correction. The signal input 221 can be adjusted through the first inverter 223-1 (indicated by "DCC Range Adjustment and the illustrated arrow through the first inverter 223-1) based on a range of signals to provide flexibility for the duty-cycle correction. As an example, changing an output rate of the inverter can allow for changes to the DCD correction step for a given DC bias voltage step.

The duty-cycle correction circuit 213 can include feedback circuitry that receives the output signal 222 and output signal 229 from the voltage comparator 239 that is provided to the state machine 231. In this example, the feedback circuitry includes the resistors 234-3, 234-4, 234-5, the capacitors 228-1, 228-2, a voltage comparator 239, the state machine 231, the resistors 234-1, 234-2, and the variable resistors 211-1, 211-2 can be used as a feedback mechanism to adjust the duty-cycle of the output signal 222 and maintain a steady value for the duty-cycle.

FIG. 3 illustrates an example duty-cycle correction circuit 313 and additional circuitry in accordance with some embodiments of the present disclosure. While illustrated as including all of the elements of FIG. 3, the examples of the duty-cycle correction circuit 313 are not so limited. For example, any portion of the elements of FIG. 3 capable of performing the operations for duty-cycle correction described below can be referred to as the duty-cycle correction circuit 313. In the illustrated example of FIG. 3, the duty-cycle correction component 313 comprises a number of inverters 323-1, 323-2 (hereinafter referred to collectively as number of inverters 323), a buffer 324, an op-amp 339, and a number of resistors 334-1, 334-2, 334-3, 334-4, 334-5 (hereinafter referred to collectively as number of resistors 234). The number of inverters 323 can be a number of NOT logic gates. In this configuration, for example, the non-inverting buffer 324 can represent a signal path and its output (node 322) can be the signal point expected to have the signal duty-cycle as close to 50% as possible.

An input signal 321 can be input to the duty-cycle correction circuit 313 and can pass through a first inverter 323-1. In one example, the first inverter 323-1 can be an inverter. The signal input 321 can be adjusted through the first inverter 323-1 (indicated by "DCC Range Adjustment and the illustrated arrow through the first inverter 323-1) based on a range of signals to provide flexibility for the duty-cycle correction. As an example, changing an output rate of the inverter can allow changes to the DCD correction step for a given DC bias voltage step. In another example, increasing a slew rate into the capacitor 227 can make the signal take longer to get from the DC bias point set by resistors 211 and 234 to the threshold of inverter 223-2. This longer transition time corresponds to an increase in the range of duty-cycle correction that can be applied by a given resistor ladder (i.e., the duty-cycle correction (in units of time) is offset/slow, the programmable slew rate can decrease slew, increasing the resolution and correction range). The signal that is transferred through the first inverter 323-1 can be received at an alternating current-coupling ("AC-coupling") component 327. In response to a switch 325 being in a closed (or ON) position, the signal can bypass the AC-coupling component 327 and provide a zero voltage initial conditional across the AC-coupling component 327. In response to the switch 325 being in an open (or OFF) position, the signal can be directed through the AC-coupling component 327. When DCC is enabled, the resistor ladder (components 324-6 and 334) can pull the inputs 323-2 to the mid-rail, for signals that do not contain high frequency content, this can result in an undesirable crowbar condition. The functionality to bypass the AC-coupling component 327 can be desirable for modes in which lower frequency signals, which may not require duty-cycle correction, may need to be passed. This low frequency bypass mode can allow the AC-coupling component 327 and the resistors 324-6 and 334 to be optimized for high-speed signal correction.

A DCC enable signal 337 can be used to enable correction of the duty-cycle distortion. As an example, the DCC enable signal 337 can enable an opening of switch 333 and an opening of the switch 325 to disable the DC coupling of the duty-cycle correction circuit 313. The duty-cycle correction enable signal 337 can also be an input to the operational amplifier 339, as illustrated in FIG. 3, which provides an adjustment of DC voltage level at the input of the second invertor 323-2 as a mechanism to correct duty-cycle distortion seen at the output signal of the buffer 324. The signal on an opposite side of the AC-coupling component 327 than the signal input 321 can be input to a second inverter 323-2. The output of the second inverter 323-2 can be input to a buffer 324. The output signal of the buffer 324 can be a signal output 322 that is a total output of the duty-cycle correction circuit 313. When the DCC enable signal is not activated, the switch 325 of the DC coupling can be closed and the resistors 334-1 and 334-2 can be opened, thereby shutting off the duty-cycle correction of the input signal 321. The transition from a close (or "ON") to an open (or "OFF") position of the switch 325 can provide a zero voltage initial conditional across the AC-coupling component 327 which can minimize an overshooting or undershooting initial voltage condition and provide a fast voltage setting time seen at the input of inverter 323-2.

A distortion of a duty-cycle associated with the input signal 321 can be minimized by using the AC-coupling component 327, the DC component node 326, the number of resistors 334, the number of inverters 323, and the number of buffers 324, resulting in the signal output 322 with the minimized distortion of the duty-cycle. As an example, the duty-cycle correction of FIG. 3 can be based on an analog calibration. That is, in contrast to the duty-cycle correction of FIG. 2 which is a digitally based duty-cycle calibration, the duty-cycle calibration of FIG. 3 is an analog calibration. The signal through the operational amplifier (e.g., "op-amp") 339 can be input through a resistor 334-6 prior to being input to the right side of the AC-coupling component 327. An output from the buffer 324-2 can also be coupled to the DC component node 326.

A duty-cycle correction range adjustment 338 can be used to adjust the signal input through the first inverter 323-1 based on a range of signals to provide flexibility for the duty-cycle correction. As an example, changing the invertor output slew rate allows for changes of the DCD correction step for a given DC bias voltage step. An upper portion of the duty-cycle correction circuit 313, including the resistors 334-3, 334-4, 334-5, capacitors 328-1, 328-2, a buffer 324-2, and the resistors 334-1, 334-2 can be used as a feedback mechanism to adjust the duty-cycle of the output signal 322 and maintain a steady value for the duty-cycle.

Figure 4:
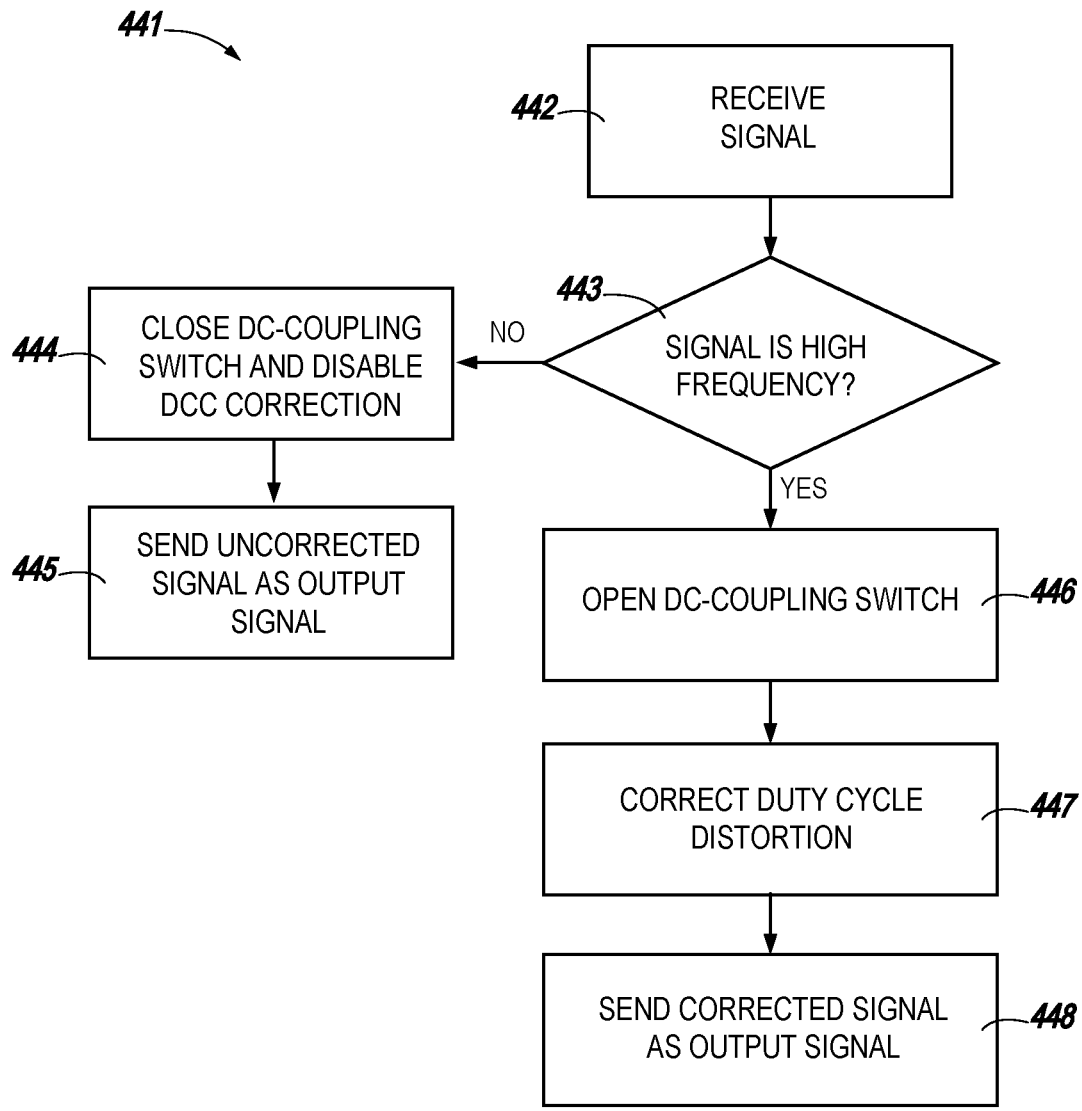
FIG. 4 is a flow diagram corresponding to a method for AC coupled duty-cycle correction in accordance with some embodiments of the present disclosure.

FIG. 4 is a flow diagram 441 of a method for duty-cycle correction in accordance with some embodiments of the present disclosure. The flow diagram 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow diagram 451 is performed by the DCC component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a signal can be received at a duty-cycle correction component (such as duty-cycle correction component 113, 213, or 313 described in FIGS. 1-3, respectively). At operation 443, whether the received signal is high frequency can be determined. In response to the received signal not being high frequency, at operation 444, a DC-coupling switch can be closed and DCC correction can be disabled. Subsequent to closing the DC-coupling switch and disabling the DCC correction, at operation 445, an uncorrected signal can be sent as an output signal (such as an output signal 222/322 in FIGS. 2/3). In response to the received signal being high frequency, a DC-coupling switch can be opened. At block 447, in response to the DC-coupling switch being opened, a duty-cycle distortion can be corrected. Further, at block 448, the corrected signal can be sent as an output signal.

Figure 5:
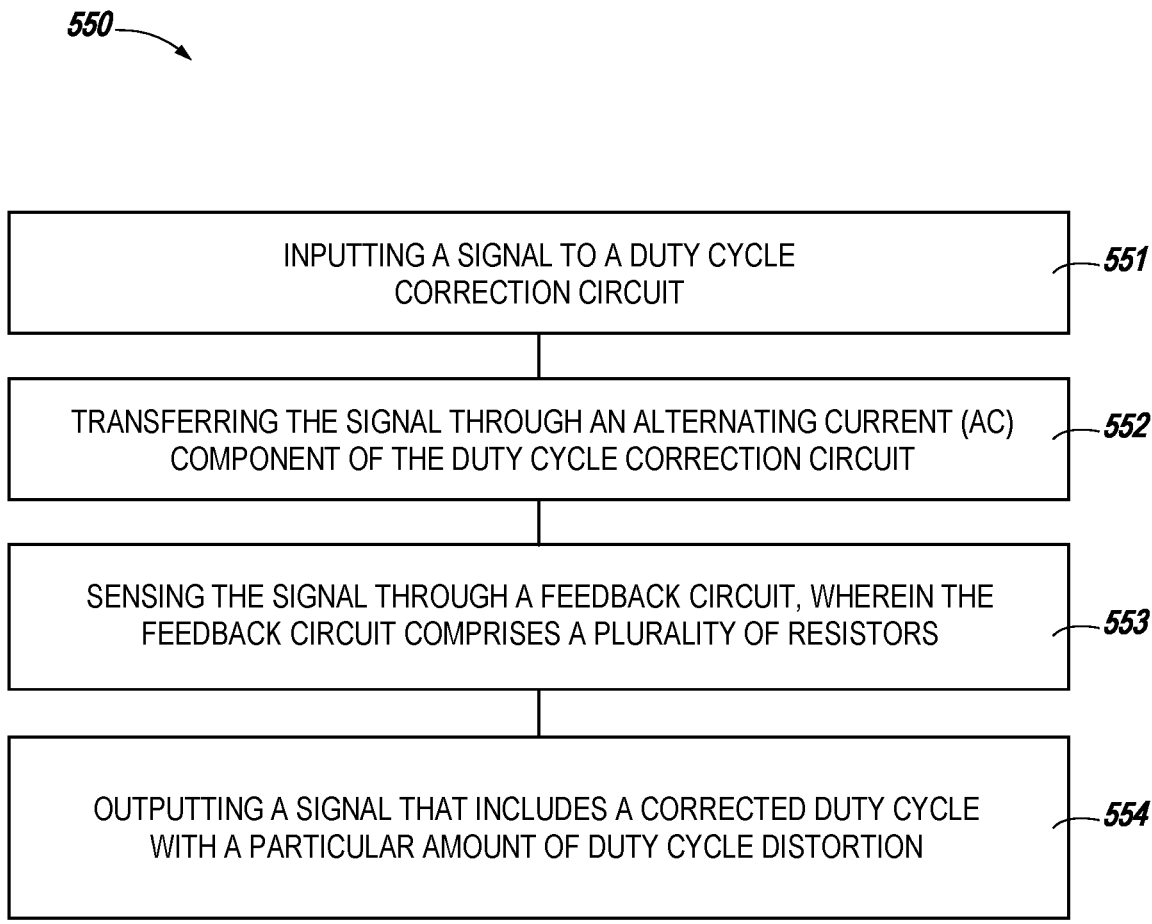
FIG. 5 is a flow diagram corresponding to a method for AC coupled duty-cycle correction in accordance with some embodiments of the present disclosure.

FIG. 5 is a flow diagram 550 corresponding to a method for duty-cycle correction in accordance with some embodiments of the present disclosure. The flow diagram 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow diagram 550 is performed by the DCC component 113, 213, or 313 of FIGS. 1-3, respectively. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 551, an input signal can be inputted to a duty-cycle correction circuit. In some examples, the duty-cycle correction circuit includes a state machine. At block 552, the input signal can be transferred through an alternating current-coupling (AC-coupling) component of the duty-cycle correction component. In some examples, the AC-coupling component can include a capacitor. The input signal can be transferred through the AC-coupling component by opening a switch of a direct current (DC) component.

At operation 553, the signal can be sensed through a feedback circuit. The feedback circuit can include resistors. In some examples, the input signal can be digitally calibrated by being input through a state machine (such as is described in association with FIG. 2 above). An output from the state machine can a duty-cycle corrected portion of the input signal. In some examples, the duty-cycle correction circuit calibrates the input signal via an analog calibration circuit (such as is described in association with FIG. 3 above). At block 554, a signal that includes a corrected duty-cycle with a particular amount of duty-cycle distortion can be output as an output signal.

In some examples, the method can include a duty-cycle correction circuit to adjust a duty-cycle correction based on a particular data rate. The method can further include a duty-cycle correction circuit to adjust the duty-cycle correction circuit by adjusting a DC bias at an output of an AC-coupling component. In some examples, the method can further include a switch of the DC component used to minimize an initial voltage overshoot during activation of the calibration of the input signal. In some examples, activation of the calibration can be performed by putting the switch of the DC component in an open position. In some examples, the amount of distortion in an output signal, from calibration of the input signal, is not affected by a change in temperature.

Figure 6:
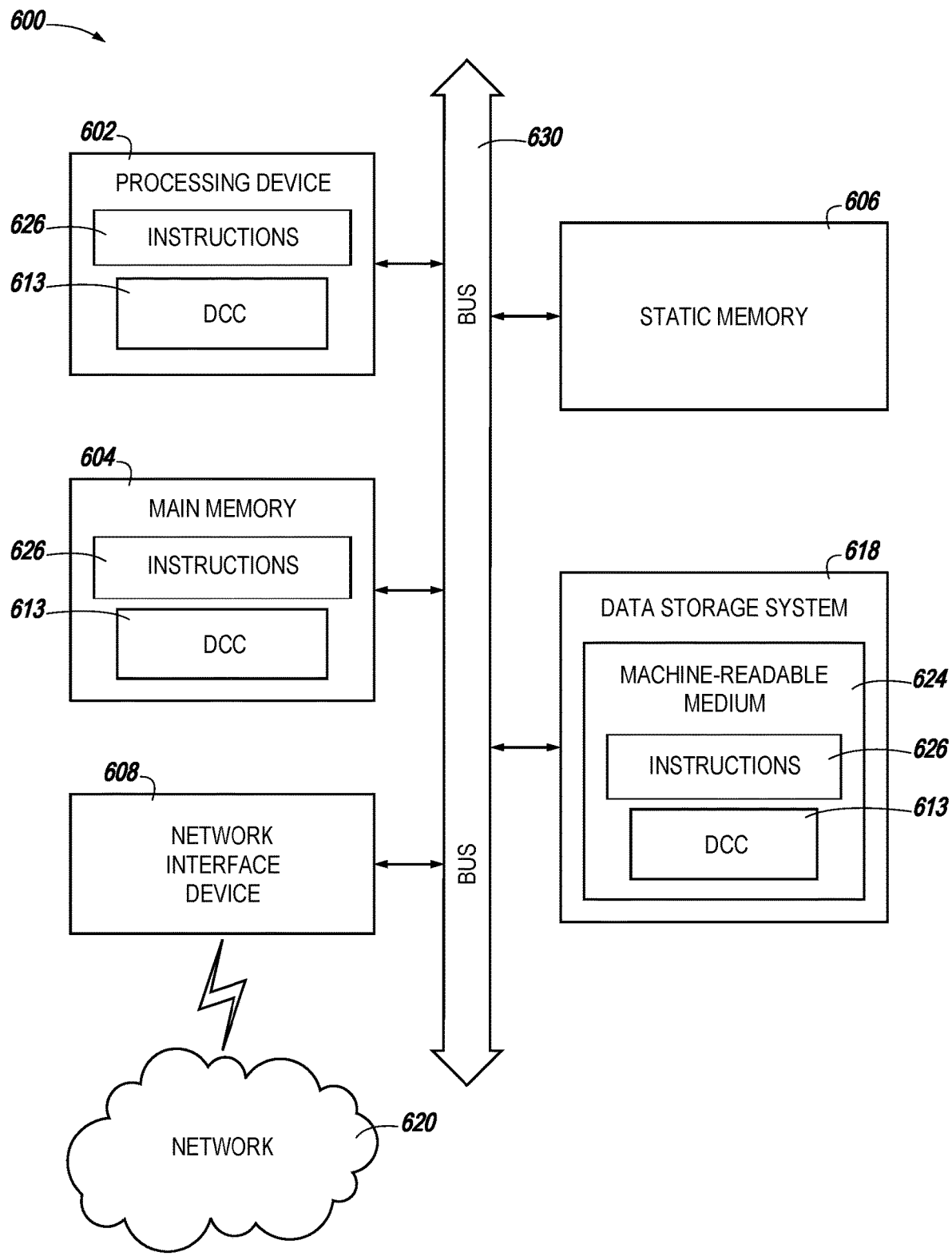
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the DCC component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing operations that can be associated with using the hardware discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software to perform operations associated with using the hardware described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to performing operations that may include using a DCC component (e.g., the DCC component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform operations associated with using hardware of any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   inputting a signal to a duty-cycle correction circuit;
   opening a switch of a direct current (DC) component to transfer the signal through an AC-coupling component;
   transferring the signal through the alternating current-coupling (AC-coupling) component of the duty-cycle correction circuit;
   transferring the signal through a feedback circuit, wherein the feedback circuit comprises a plurality of resistors; and
   outputting a signal that includes a corrected duty-cycle with a particular amount of duty-cycle distortion.

2. The method of claim 1, wherein the AC-coupling component comprises a capacitor.

3. The method of claim 1, wherein the duty-cycle correction circuit comprises a state machine; and wherein the method further comprises digitally calibrating the output signal.

4. The method of claim 1, wherein the duty-cycle correction circuit calibrates the output signal via an analog calibration circuit.

5. A duty-cycle correction circuit, comprising:
   an alternating current-coupling (AC-coupling) component;
   a direct current (DC) component coupled to the AC-coupling component, wherein the DC component comprises a switch to activate the AC-coupling component; and
   a state machine connected to the AC-coupling component via a plurality of resistors and via the DC component;
   wherein
   the AC-coupling component is configured to: receive an input signal; and
   cause a correction of the duty-cycle associated with the input signal that decreases a distortion of the duty-cycle a particular amount.

6. The duty-cycle correction circuit of claim 5,
   wherein the state machine is configured to calibrate an output signal to decrease an amount of distortion of a duty-cycle associated with the input signal and a downstream signal path between the input signal and the output signal.

7. The duty-cycle correction circuit of claim 5, further comprising a duty-cycle correction range adjustment component configured to adjust a correction range based on a data rate associated with the input signal.

8. The duty-cycle correction circuit of claim 5, wherein the switch of the DC component is configured to, in an open position, activate the AC-coupling component and the calibration of the output signal.

9. The duty-cycle correction circuit of claim 5, wherein:
   in response to the switch being in an open position, a duty-cycle signal includes a first amount of distortion; and in response to the switch being in a closed position, the duty-cycle signal includes a second amount of distortion;
wherein the first amount is less than the second amount.

10. The duty-cycle correction circuit of claim 5, wherein the AC-coupling component is configured to:
adjust a duty-cycle correction based on a particular data rate; and
adjust the duty-cycle correction by adjusting a DC bias at an output of the AC-coupling component.

11. The duty-cycle correction circuit of claim 5, wherein:
the switch of the DC component is configured to minimize an initial voltage overshoot and undershoot during activation of the calibration of the output signal; and
the activation of the calibration is performed by putting the switch of the DC component in an open position.

12. The duty-cycle correction circuit of claim 5, wherein the amount of distortion in an output signal, from calibration of the output signal, is not significantly affected by a change in temperature.

13. A system, comprising:
a memory sub-system comprising a memory array and a duty-cycle correction circuit; and
a processing device coupled to the memory-subsystem, the processing device to perform operations comprising:
inputting a signal to the duty-cycle correction circuit, wherein the input signal includes a first amount of duty-cycle distortion;
performing a duty-cycle correction on an output signal, wherein the duty-cycle correction is performed using an alternating current-coupling (AC-coupling) component configured to vary a duty-cycle of the input signal; and
output a signal from the correction of the input signal, wherein the output signal includes a second amount of duty-cycle distortion;
wherein the first amount is greater than the second amount.

14. The system of claim 13, further comprising a direct current (DC) component coupled to the AC-coupling component and used as a switch.

15. The system of claim 14, further comprising a state machine coupled to the DC component via a plurality of resistors.

16. The system of claim 13, further comprising a duty-cycle enable portion configured to send an enable signal to the duty-cycle correction circuit.

17. The system of claim 13, wherein the duty-cycle correction circuit comprises a plurality of inverters and an operational amplifier.

18. The system of claim 13, wherein the AC-coupling component comprises a capacitor.

19. A method, comprising:
inputting a signal to a duty-cycle correction circuit, wherein
the duty-cycle correction circuit is a state machine;
transferring the signal through an alternating current-coupling (AC-coupling) component of the duty-cycle correction circuit;
transferring the signal through a feedback circuit, wherein the feedback circuit comprises a plurality of resistors;
digitally calibrating an output signal that includes a corrected duty-cycle with a particular amount of duty-cycle distortion; and
outputting the output signal.

20. The method of claim 19, further comprising:
inputting the output signal to the state machine; and
outputting, from the state machine, a duty-cycle corrected portion of the output signal.

21. A method, comprising:
inputting a signal to a duty-cycle correction circuit;
transferring the signal through an alternating current-coupling (AC-coupling) component of the duty-cycle correction circuit;
transferring the signal through a feedback circuit, wherein the feedback circuit comprises a plurality of resistors;
calibrating an output signal via an analog calibration circuit; and
outputting the output signal, wherein the output signal includes a corrected duty-cycle with a particular amount of duty-cycle distortion.

22. A duty-cycle correction circuit, comprising:
an alternating current-coupling (AC-coupling) component;
a direct current (DC) component coupled to the AC-coupling component, wherein the DC component comprises a switch to activate the AC-coupling component;
wherein
the AC-coupling component is configured to: receive an input signal;
adjust a duty-cycle correction based on a particular data rate;
adjust the duty-cycle correction by adjusting a DC bias at an output of the AC-coupling component; and
cause a correction of the duty-cycle associated with the input signal that decreases a distortion of the duty-cycle a particular amount.

23. A duty-cycle correction circuit, comprising:
an alternating current-coupling (AC-coupling) component;
a direct current (DC) component coupled to the AC-coupling component, wherein the DC component comprises a switch to activate the AC-coupling component;
wherein:
the AC-coupling component is configured to: receive an input signal; and
cause a correction of the duty-cycle associated with the input signal that decreases a distortion of the duty-cycle a particular amount; and
the amount of distortion in an output signal, from calibration of the output signal, is not significantly affected by a change in temperature.

* * * * *